United States Patent
Cross et al.

(10) Patent No.: US 7,473,949 B2
(45) Date of Patent: Jan. 6, 2009

(54) FERROELECTRIC CAPACITOR AND METHOD OF MANUFACTURING THE SAME

(75) Inventors: Jeffrey Scott Cross, Kawasaki (JP); Mineharu Tsukada, Kawasaki (JP); John David Baniecki, Kawasaki (JP); Kenji Nomura, Kawasaki (JP); Igor Stolichnov, Lausanne (CH)

(73) Assignee: Fujitsu Limited, Kawasaki (JP)

( * ) Notice: Subject to any disclaimer, the term of this patent is extended or adjusted under 35 U.S.C. 154(b) by 179 days.

(21) Appl. No.: 11/081,663

(22) Filed: Mar. 17, 2005

(65) Prior Publication Data

US 2005/0156216 A1 Jul. 21, 2005

Related U.S. Application Data

(63) Continuation of application No. PCT/JP03/15809, filed on Dec. 10, 2003.

(30) Foreign Application Priority Data

Dec. 10, 2002 (JP) ............................. 2002-358535

(51) Int. Cl.
  *H01L 29/92* (2006.01)
(52) U.S. Cl. ............... 257/295; 257/310; 257/E27.048; 257/E27.104
(58) Field of Classification Search ................. 257/295, 257/306, 310, E27.086, E27.104, E21.009, 257/E21.208, E21.209, E21.663, E21.664
See application file for complete search history.

(56) References Cited

U.S. PATENT DOCUMENTS 5,270,298 A  12/1993 Ramesh (Continued)

FOREIGN PATENT DOCUMENTS

CN   1292931 A   4/2001

(Continued)

OTHER PUBLICATIONS

Patent Abstracts of Japan, Publication No. 2001127262 A, published on May 11, 2001.

(Continued)

*Primary Examiner*—Ngan Ngo
*Assistant Examiner*—Benjamin Tzu-Hung Liu
(74) *Attorney, Agent, or Firm*—Westerman, Hattori, Daniels & Adrian, LLP.

(57) ABSTRACT

After a step of fabricating a MOS transistor (14) on a semiconductor substrate (11) and further steps up to bury a W plug (24), an Ir film (25*a*), an IrO$_y$ film (25*b*), a PZT film (26), and an IrO$_x$ film (27) are formed sequentially over the entire surface. The composition of the PZT film (26) is such that the content of Pb exceeds that of Zr and that of Ti. After processing the Ir film (25*a*), the IrO$_y$ film (25*b*), the PZT film (26) and the IrO$_x$ film (27), annealing is effected to remedy the damage to the PZT film (26) that is caused when the IrO$_x$ film (27) is formed and to diffuse Ir in the IrO$_x$ film (27) into the PZT film (26). As a result, the Ir diffused into the PZT film (26) concentrates at an interface between the IrO$_x$ film (27) and the PZT film (26) and at grain boundaries in the PZT film (26), and the Ir concentrations at the interface and boundaries are higher than those in the grains.

11 Claims, 21 Drawing Sheets

U.S. PATENT DOCUMENTS

| | | | | |
|---|---|---|---|---|
| 5,739,563 | A | * | 4/1998 | Kawakubo et al. .......... 257/295 |
| 5,751,540 | A | * | 5/1998 | Lee et al. ................. 361/321.4 |
| 6,472,229 | B1 | * | 10/2002 | Aoki et al. ..................... 438/3 |
| 2001/0051381 | A1 | * | 12/2001 | Yang et al. ..................... 438/3 |
| 2002/0117700 | A1 | * | 8/2002 | Fox ........................... 257/295 |

FOREIGN PATENT DOCUMENTS

| | | |
|---|---|---|
| EP | 1 253 627 A2 | 10/2002 |
| EP | 1 276 139 A2 | 1/2003 |
| JP | 2002-47011 | 2/2002 |
| JP | 2002-289811 | 10/2002 |
| JP | 2002-324895 | 11/2002 |
| WO | WO 00/17929 | 3/2000 |

OTHER PUBLICATIONS

Patent Abstracts of Japan, Publication No. 2000260954 A, published on Sep. 22, 2000.

Patent Abstracts of Japan, Publication No. 10341010 A, published on Dec. 22, 1998.

Takashi Nakamura et al., Preparation of Pb (Zr,Ti) O3 Thin Films on Ir and IrO2 Electrodes, Jpn.J.Appl.Phys. vol. 33, pp. 5207-5210 (1994).

Keiko Kushida-Abdelghafar et al., Post-annealing effects on antireduction characteristics of IrO2/Pb . . . , Journal of Applied Physics, vol. 85, No. 2, Jan. 15, 1999.

Tomoyuki Sakoda et al., Hydrogen-Robust Submicron IrOx/Pb . . . , Jpn. J.Appl.Phys., vol. 40, pp. 2911-2916 (2001).

T. Hase et al., Fatigue Characteristics of PZT Capacitors with . . . , In: Proceeding 11th IEEE International Symposium on Applications of Ferroelectrics 1998,pp. 7-10.

Office Action dated Dec. 8, 2006 issued in corresponding Chinese Patent Application No. 2003 801007900.

* cited by examiner

FERROELECTRIC CAPACITOR AND METHOD OF MANUFACTURING THE SAME

This application is a continuation of international application PCT/JP03/15809 filed on Dec. 10, 2003.

TECHNICAL FIELD

The present invention relates to a ferroelectric capacitor suitable for a ferroelectric nonvolatile memory (FRAM (a registered trademark of Ramtron International Corporation)) and so forth and a method of manufacturing the same.

BACKGROUND ART

A computer uses a volatile memory such as a dynamic random access memory (DRAM) and a static random access memory (SRAM), or the like for its main storage. The volatile memory can retain data only while electric power source is supplied, and loses the stored data when the power source supply is turned off. Meanwhile, recently, as a nonvolatile memory, which is freely rewritable and does not lose data even if the power source supply is turned off, a ferroelectric random access memory (hereinafter referred to as a "FeRAM") utilizing a ferroelectric film has gathered much attention. The FeRAM has advantages in that it can be highly integrated and consumes low electric power in addition to it is a nonvolatile memory.

Conventional FeRAMs are provided with a ferroelectric capacitor (hereinafter also referred to as a "FeCap") 205 configured by sandwiching a ferroelectric film 203 between two electrodes 204 and 202, as shown in FIG. 15. The FeCap 205 is formed, for example, above a substrate 201 via an insulating film and the like (not shown). The FeCap 205 constitutes a functional main part of the FeRAM. The FeCap is also used for a sensor, sometimes. The electrodes 202 and 204 sandwiching the ferroelectric film 203 are called a lower electrode and an upper electrode, respectively.

As for materials of the ferroelectric film and the electrode, many research studies have been carried out and thereby various materials are proposed. For the ferroelectric film 203, $Pb(Zr,Ti)O_3$ (hereinafter also referred to as a "PZT"), $(Bi,La)_4Ti_3O_{12}$, $SrBi_2Ta_2O_9$, or the like are mainly used.

Further, as an upper electrode, that composed of a Pt film is mainly used, however, that composed of a composite film of a $SrRuO_3$ film and a Pt film, that composed of a conductive oxide film such as a $(La,Sr)CoO_3$ film or an $IrO_2$ film, and so forth have also been researched.

For improving storage density of such a FeRAM, the FeCap is required to have stable characteristics. As an important characteristic of the FeCap, there is a polarization characteristic. The polarization characteristic degrades due, for example, to fatigue of the ferroelectric film. This type of fatigue is observed when the ferroelectric film is repeatedly switched by an electric field many times. Although the ferroelectric film is required to have an endurance to $10^{12}$ cycles of the switching electric field nowadays, the endurance upto $10^{15}$ cycles of the switching electric field is considered to be required in the future. Further, the FeCap must also have a low leakage current.

However, when the upper electrode composed of a composite film consisting of $SrRuO_3$ film and Pt film is utilized, the $SrRuO_3$ film itself does not function as an electrode, so that the stacked structure with the Pt film is employed. Therefore, as compared to the upper electrode composed only of the Pt film, the manufacturing processes increase in number and the manufacturing time may increase.

Further, there is a report stating that the fatigue becomes more difficult to be caused when the upper electrode composed of the conductive oxide film such as the $(La,Sr)CoO_3$ film or the $IrO_2$ film is utilized. However, the mechanism has not yet been figured out, and whether or not the fatigue actually becomes difficult to be caused is still uncertain.

Further, the combination of the ferroelectric film composed of the PZT and an upper electrode composed of the $IrO_2$ has also been examined (Patent Document 4, Patent Document 5 and Non-Patent Document 1 to 3), however, optimized characteristics have not yet been obtained, so that further improvements are expected. Still further, in the methods described in Patent Document 4 and Patent Document 5, after the ferroelectric film is crystallized, the surface layer thereof is needed to be removed, so that the manufacturing process is complicated.

(Patent Document 1) Japanese Patent Application Laid-Open No. 2001-127262

(Patent Document 2) Japanese Patent Application Laid-Open No. 2000-260954

(Patent Document 3) United States Patent No.

(Patent Document 4) Japanese Patent Application Laid-Open No. Hei 10-341010

(Patent Document 5) United States Patent No.

(Non-Patent Document 1) T. Nakamura, et al., Jpn. J. Appl. Phys. 33, 5207 (1994)

(Non-Patent Document 2) K. Kushida-Abdelghafar, et al, J. Appl. Phys. 85, 1069 (1999)

(Non-Patent Document 3) T. Sakoda, et al., Jpn. J. Appl. Phys. 40, 2911 (2001)

SUMMARY OF THE INVENTION

The present invention was made in view of the above-described problems, and an object thereof is to provide a ferroelectric capacitor having a simple configuration and capable of obtaining a high fatigue endurance characteristic and a method of manufacturing the same.

After due diligent efforts to bring a solution to the problems, the present inventors have devised embodiments which will be described below.

The ferroelectric capacitor according to the present invention includes a lower electrode, a ferroelectric film formed on the lower electrode, and an upper electrode formed on the ferroelectric film and composed of a conductive compound. In the present invention, a cation composing the conductive compound also exists in the ferroelectric film.

In a method of manufacturing the ferroelectric capacitor according to the present invention, first, a ferroelectric film is formed on a lower electrode. Next, an upper electrode composed of a conductive compound is formed on the ferroelectric film. A cation composing the conductive compound is diffused into the ferroelectric film by annealing.

In the present invention, a cation of a conductive compound composing an upper electrode is included also in a ferroelectric film, so that leakage current increases. Generally, it is known that, in a ferroelectric capacitor provided with an electrode composed of a conductive compound, a fatigue characteristic is improved as leakage current increases. Accordingly, in the present invention, a preferable fatigue characteristic can be obtained.

DETAILED DESCRIPTION OF THE PREFERRED EMBODIMENTS

Hereinafter, a ferroelectric capacitor and a method of manufacturing the same according to embodiments of the present invention will be described in concrete form with reference to the attached drawings. It should be noted here, however, that the structure of the ferroelectric capacitor will be described together with its manufacturing method for convenience. In the present embodiment, a ferroelectric memory including a ferroelectric capacitor is manufactured. FIGS. 1A to 1G are sectional views sequentially illustrating a method of manufacturing the ferroelectric capacitor according to the embodiment of the present invention.

Figure 1A:
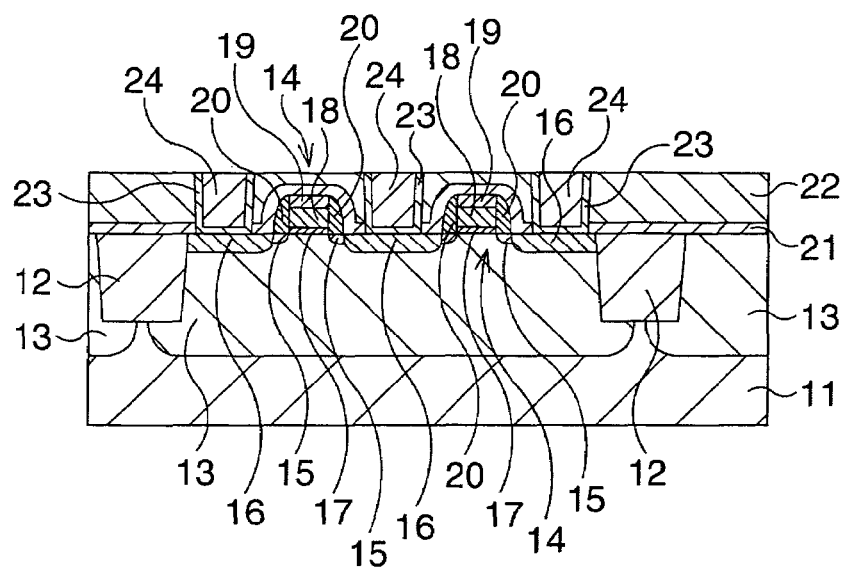
FIGS. 1A to 1G are sectional views sequentially illustrating a method of manufacturing a ferroelectric capacitor according to an embodiment of the present invention.

First, as shown in FIG. 1A, element isolation regions 12 are formed on a semiconductor substrate 11 such as of a silicon substrate, for example, by STI (shallow trench isolation). Next, in an element active region partitioned by the element isolation regions 12, a well 13 is formed on the surface of the semiconductor substrate 11. Subsequently, a gate insulating film 17, a gate electrode 18, a silicide layer 19, a low-concentration diffusion layer 15, a sidewall 20, and a high-concentration layer 16 are formed on the surface of well 13 to thereby form a MOS transistor 14. Note that, in respective MOS transistors 14, two high-concentration layers 16 are formed for a source and a drain, and one of the two is shared between two MOS transistors 14.

Subsequently, a silicon oxynitride film 21 is formed over the entire surface to cover the MOS transistors 14, and further a silicon oxide film 22 is formed over the entire surface, for example, by an organic CVD method. The silicon oxynitride film 21 is formed to prevent the gate insulating film 17 and the like from hydrogen-induced degradation when forming the silicon oxide film 22. After that, contact holes reaching to respective high-concentration layers 16 are formed in the silicon oxide film 22 and the silicon oxynitride film 21 to thereby open plug contact sections. After a stacked film composed of a TiN film of 50 nm and a Ti film of 30 nm is formed as a glue film 23 in the contact hole, a W film is buried therein for example by a CVD method, and a CMP (Chemical Mechanical Polishing) is performed to smooth, so that a W plug 24 is formed.

Figure 1B:
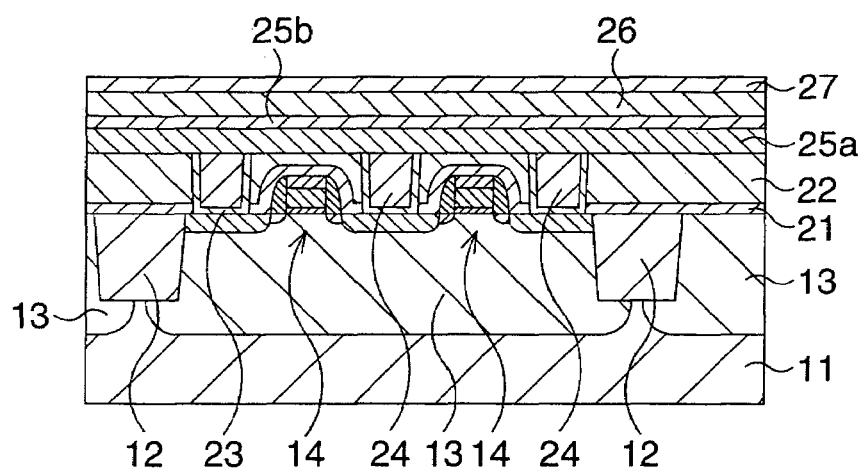

Subsequently, as shown in FIG. 1B, an Ir film $25a$, an $IrO_y$ film (Ir oxide film) $25b$, a PZT film 26, and an $IrO_x$ film 27 are formed sequentially over the entire surface ($1<x<2$, $1<y<2$). At this time, as for the composition of the PZT film 26, the content of Pb is set to exceed that of Zr and Ti. Specifically, when the content of Pb, the content of Zr, and the content of Ti are respectively represented by [Pb], [Zr], and [Ti], it is set to satisfy an equality: $[Pb]/([Zr]+[Ti])>1$.

Figure 1C:
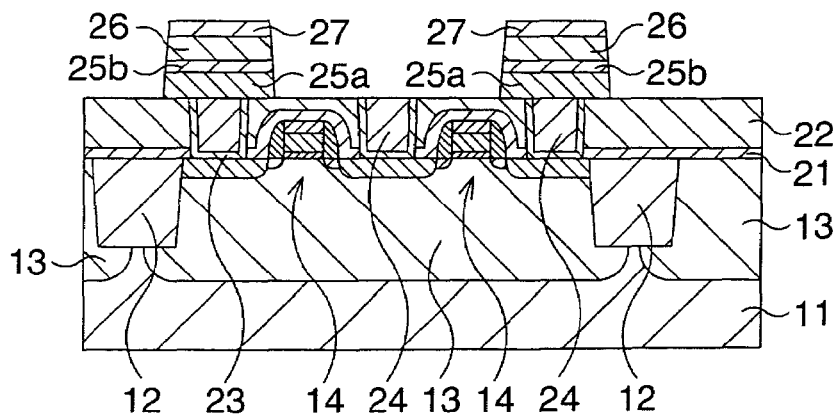

Subsequently, as shown in FIG. 1C, a ferroelectric capacitor of a stacked structure, in which the $IrO_x$ film 27 is used as an upper electrode and the Ir film $25a$ and the $IrO_y$ film $25b$ are used as a lower electrode with the PZT film 26 sandwiched therebetween, is formed by processing the Ir film $25a$, the $IrO_y$ film $25b$, the PZT film 26, and the $IrO_x$ film 27 with patterning and etching techniques. Note that, in this processing, a stacked film (not shown) of a plasma TEOS (tetraethyl orthosilicate) film and a TiN film is used as a hard mask, and the Ir film $25a$, the $IrO_y$ film $25b$, the PZT film 26, and the IrOx film 27 are etched in a lump.

Figure 16A:
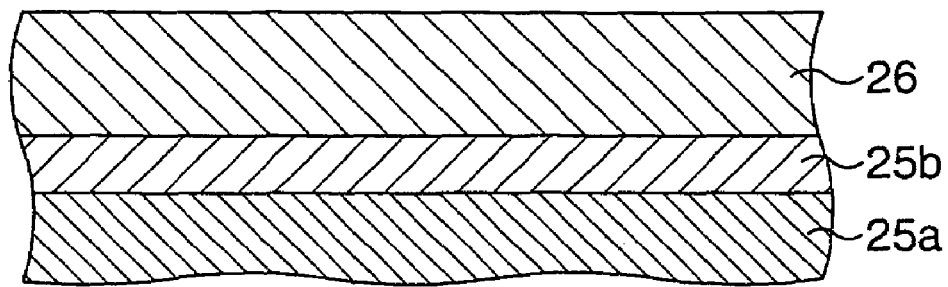
FIGS. 16A and 16B are sectional views illustrating a shape change of the PZT film according to the embodiment of the present invention.
Figure 16B:
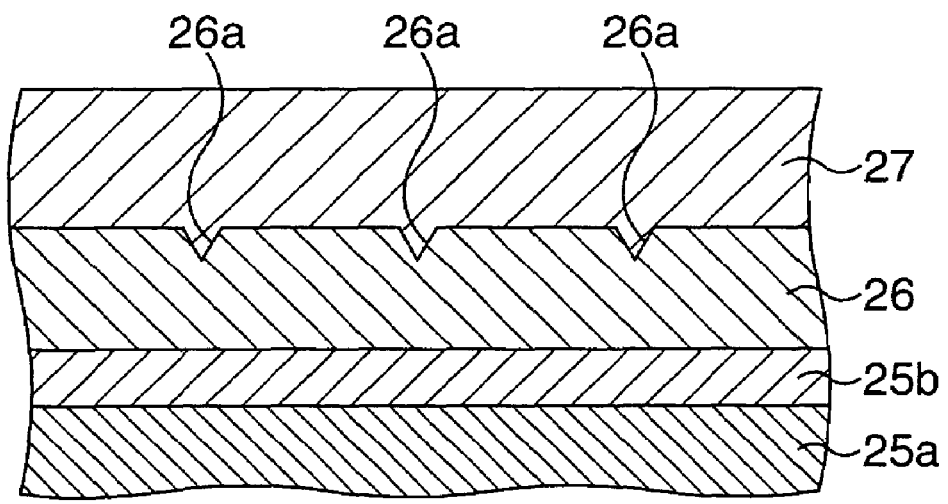

Subsequently, an annealing step is performed to remedy the damage in the PZT film 26 during formation of the $IrO_x$ film 27 and the like, and to diffuse Ir in the $IrO_x$ film 27 into the PZT film 26. As a result, the Ir diffused into the PZT film 26 concentrates at an interface between the $IrO_x$ film 27 and the PZT film 26, and also at grain boundaries in the PZT film 26, so that the Ir concentrations of these become higher than that in the grains. In the present embodiment, in the step shown in FIG. 1B, the PZT film 26 is formed in an amorphous state at a room temperature for example by sputtering. In this state, as shown in FIG. 16A, the surface of the PZT film 26 has relatively higher smoothness. Hence, with the above-described annealing, the PZT film 26 is crystallized and grooves $26a$ appear on the surface corresponding to the grain boundaries thereof as shown in FIG. 16B, so that the smoothness degrades. Further, based on the change, the composition of the PZT film varies within the surface and in the film thickness direction normal to the surface. By taking advantage of the effect, also for a ferroelectric capacitor having a film thickness operating at low voltage, it is possible to control the composition so as to obtain a desired polarization characteristic.

Figure 1D:
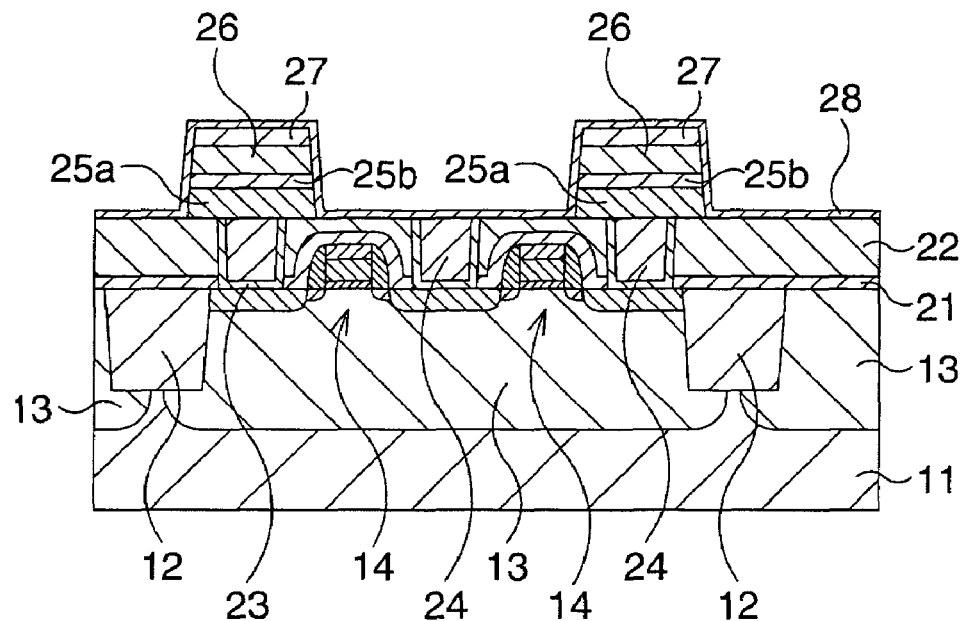

Subsequently, as shown in FIG. 1D, an alumina protective film 28 covering the ferroelectric capacitors is formed over the entire surface. The alumina protective film 28 is formed for example by a CVD method.

Figure 1E:
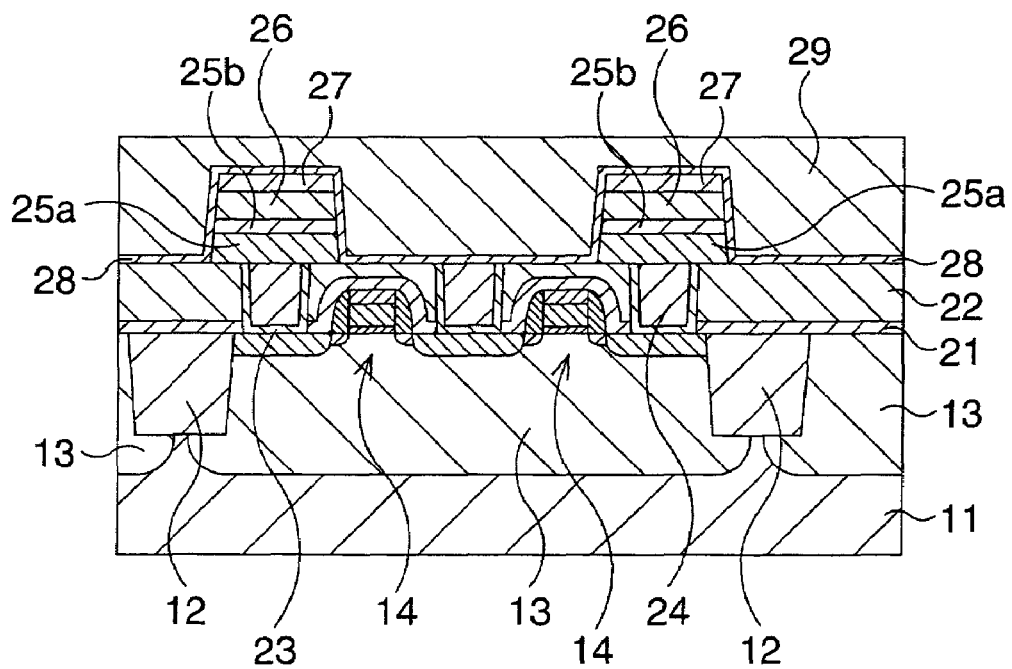

Subsequently, as shown in FIG. 1E, an interlayer insulating film 29 is formed over the entire surface and is smoothed thereafter by a CMP. As an interlayer insulating film 29, for example, a silicon oxide film is formed using a HDP (High Density Plasma) CVD apparatus. Further, a TEOS oxide film may be formed as the interlayer insulating film 29. The remaining film thickness after the CMP is set to 300 nm above the upper electrode 27, for example.

Figure 1F:
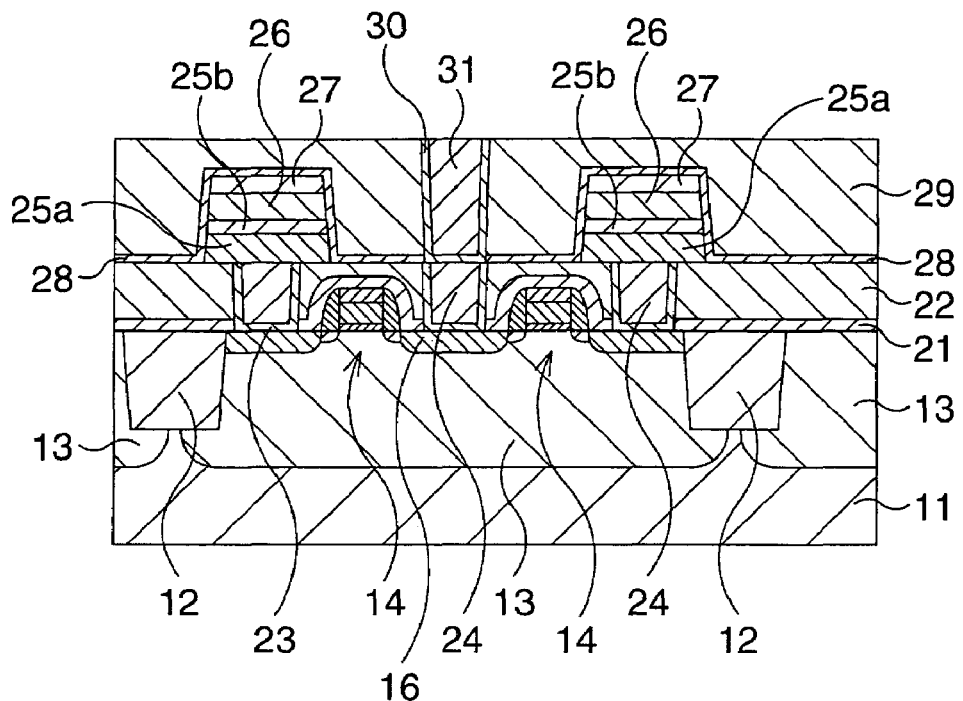

Subsequently, as shown in FIG. 1F, a contact hole reaching to the W plug 24 connected to the high-concentration layer 16 shared by the two MOS transistors 14 is formed in the interlayer insulating film 29 and the alumina protective film 28 with patterning and etching techniques. Next, a W plug 31 is formed by forming a TiN film of 50 nm, for example, as a glue film 30 in the contact hole, burying a W film thereafter by a CVD method, for example, and performing a CMP (chemical mechanical polishing) for smoothing. After that, the surfaces of the interlayer insulating film 29 and the W plug 31 are exposed to an $N_2$ plasma for example at 350° C. The time of this plasma processing is 120 seconds, for example.

Figure 1G:
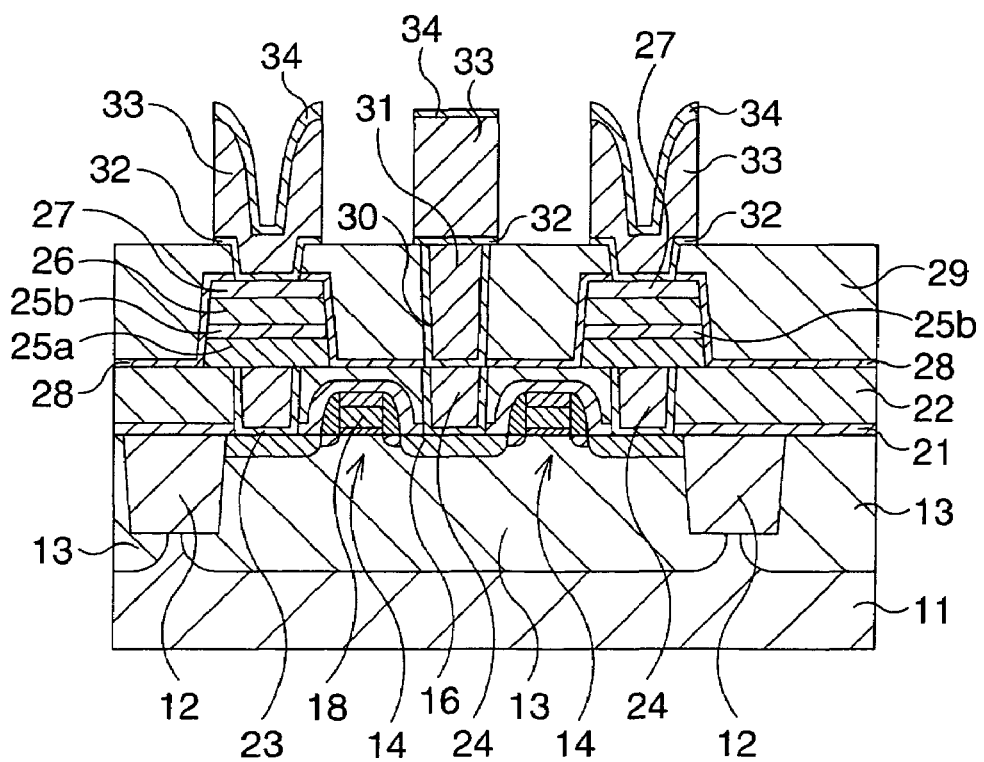

Subsequently, a W antioxidant film (not shown) is formed over the entire surface. As the W antioxidant film, a SiON film, for example, may be used, and the film thickness is, for example, approximately 100 nm. With the use of patterning and etching techniques, a contact hole reaching to the $IrO_x$ film 27 being the upper electrode is formed in the W antioxidant film and the interlayer insulating film 29, as shown in FIG. 1G. Next, an annealing is performed to remedy a damage caused by the etching. The annealing may be, for example, a furnace annealing in an $O_2$ atmosphere at 550° C., and the time is, for example, for 60 minutes. After the annealing, the W antioxidant film is removed by etching back.

Subsequently, a glue film, a wiring material film, and a glue film are deposited sequentially. As the lower glue film, for example, a stacked film of a TiN film having a thickness of 70 nm and a Ti film having a thickness of 5 nm may be formed; as the wiring material film, for example, an Al—Cl alloy film having a thickness of 400 nm may be formed; and as the upper glue film, for example, a stacked film of a TiN film having a thickness of 30 nm and a TiN film having a thickness of 60 nm may be formed.

Subsequently, an antireflection film is formed on the upper glue film by coating and a resist is coated further thereon. Subsequently, the resist film is processed to match with a wiring pattern, and by using the processed resist film as a mask, an etching is performed to the antireflection film, the upper glue film, the wiring material, and the lower glue film. As the antireflection film, for example, a SiON film may be used, and the thickness is, for example, 30 nm. With such an etching, a glue film 32, a wiring 33, and a glue film 34 are formed, as shown in FIG. 1G.

After that, further, formation of an interlayer insulating film, formation of a contact plug, formation of wirings for the second layer from the bottom and following layers, and so forth are performed. Then, a cover film composed, for example, of a TEOS oxide film and a SiN film is formed to thereby complete the ferroelectric memory including the ferroelectric capacitor.

As described above, in the present embodiment, the content of Pb in the PZT film 26 is set to be excessive, and the Ir in the $IrO_x$ film 27 whose composition is out of the stoichiometric composition ($IrO_2$) is diffused into the PZT film 26. As a result, a conduction path is generated in the PZT film 26, and thereby leakage current increases as compared to a FeCap using a Pt film as an upper electrode. It is generally known that the fatigue decreases as leakage current increases in a ferroelectric capacitor provided with an electrode composed of a conductive oxide film and a ferroelectric film such as of a PZT film. Therefore, it can be said that, according to the present embodiment, a preferable fatigue characteristic can be obtained. Incidentally, leakage current is relatively permitted in a ferroelectric capacitor provided that the leakage current does not affect other ferroelectric characteristics adversely, whereas improvement in fatigue characteristic asymptotically comes close to a saturated state when the leakage current is increased to a certain level. Therefore, the fatigue characteristic does not become more preferable in accordance with the increasing leakage current, and thus when the fatigue characteristic is already preferable, then the leakage current is not required to be increased further.

Note that the upper electrode composed of other than a layer of conductive compound film is also acceptable. For instance, it may be composed of a stacked film composed of an $IrO_{1.4}$ film formed on the ferroelectric film and an $IrO_2$ film formed thereon. At this time, the thicknesses of the $IrO_{1.4}$ film and the $IrO_2$ film are, for example, approximately 50 nm and approximately 150 nm to 200 nm, respectively, however, they are not limited thereto.

Additionally, the materials of the ferroelectric film and the upper electrode are not limited in specific. As an upper electrode, for example, a conductive oxide film, for example, of an Ir oxide film, Ba oxide film, or the like may be used. At this time, preferably, the compositions of these are out of the stoichiometric composition. As a ferroelectric film, for example, a $Pb(Zr,Ti)O_3$ film, a $(Ba,Sr)TiO_3$ film, a $(Bi,La)_4Ti_3O_{12}$ film, or the like may be used. However, when using the $Pb(Zr,Ti)O_3$ film, Pb is needed to be in excess, when using the $(Ba,Sr)TiO_3$ film, Ba is needed to be excess, and when using the $(Bi,La)_4Ti_3O_{12}$ film, Bi is needed to be excess. Further, preferably, the upper electrode contains 10% by mass or less of a cation such as of Pb, Sr, or the like and an impurity in total. With appropriate amounts of cation and/or impurity contained, the effect that is obtainable by the present invention further upgrades.

Further, the material of the lower electrode is not limited in specific in similar fashion, and the lower electrode may be composed of a Pt film, an Ir film, an $IrO_y$ film, or the like.

Subsequently, description will be given for the results of various experimental tests actually conducted by the present inventors. Here, the tests were conducted for two samples. One sample (first sample) was a FeCap including an upper electrode composed of an $IrO_{1.4}$ film (mixture of an $IrO_2$ film and an Ir film) and a PZT film containing excess Pb, in which Ir in the upper electrode is diffused into the PZT film in the course of the manufacturing process. The other sample (second sample) was a FeCap including an upper electrode composed of an $IrO_2$ film and a PZT film whose content of Pb balanced with the content of Zr and Ti. The thicknesses of the upper electrodes were both set to 200 nm.

Note that when forming the PZT films of the first and second samples, films in an amorphous state formed at room temperature were crystallized by annealing in the same manner as in the embodiment shown in FIGS. 1A to 1G. However, for the first sample, an $IrO_x$ film was formed after performing a RTA at approximately 580° C. to the PZT film in an amorphous state, and an annealing for crystallization was performed thereafter. Meanwhile, for the second sample, an $IrO_2$ film was formed after performing the RTA at a high temperature of approximately 725° C. to the PZT film in an amorphous state, and an annealing was performed thereafter. Therefore, as described later, after the RTA, in the first sample, the PZT film was scarcely crystallized and the surface thereof was relatively smooth, however, in the second sample, the PZT film was crystallized by the RTA, and there were formed in the surface minute grooves along the grain boundaries and the surface was coarser than that of the first sample. Moreover, the $IrO_2$ film had entered into the inside of the groove when the $IrO_2$ film was formed.

First, the result of an analysis by an X-ray diffraction will be described. The PZT has a perovskite structure of a tetragonal phase in view of a crystal structure and crystal system. The calculation result of the ratio of the length of "c" axis to the length of "a" axis (c/a) of the first sample was 1.0036. Meanwhile the ratio (c/a) of the second sample was 1.008. As a result, the diffusion of Ir into the PZT film was considered to lower the ratio (c/a). Note that the Curie temperatures were at 325° C. in both the cases.

Figure 2:
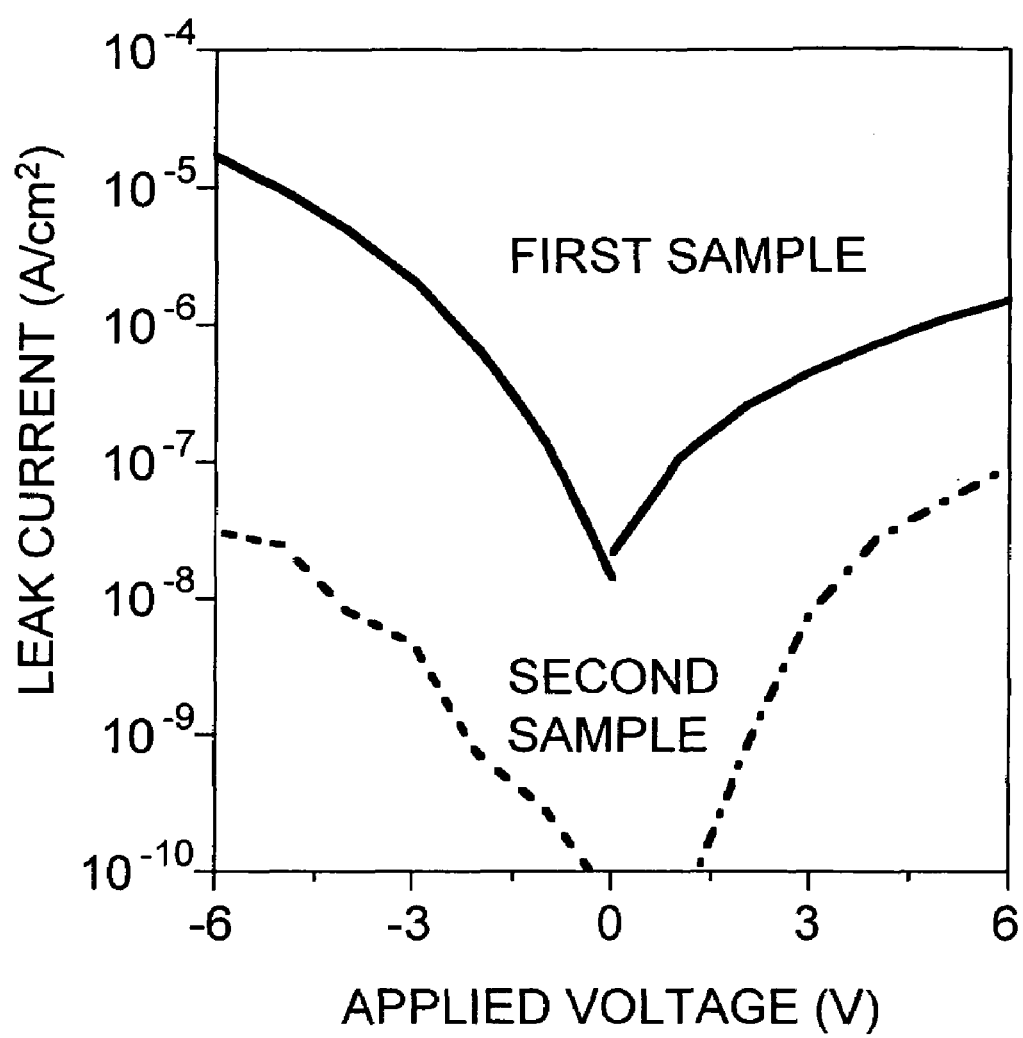
FIG. 2 is a graphic chart showing a measurement result of leakage current 100 seconds.
Figure 3:
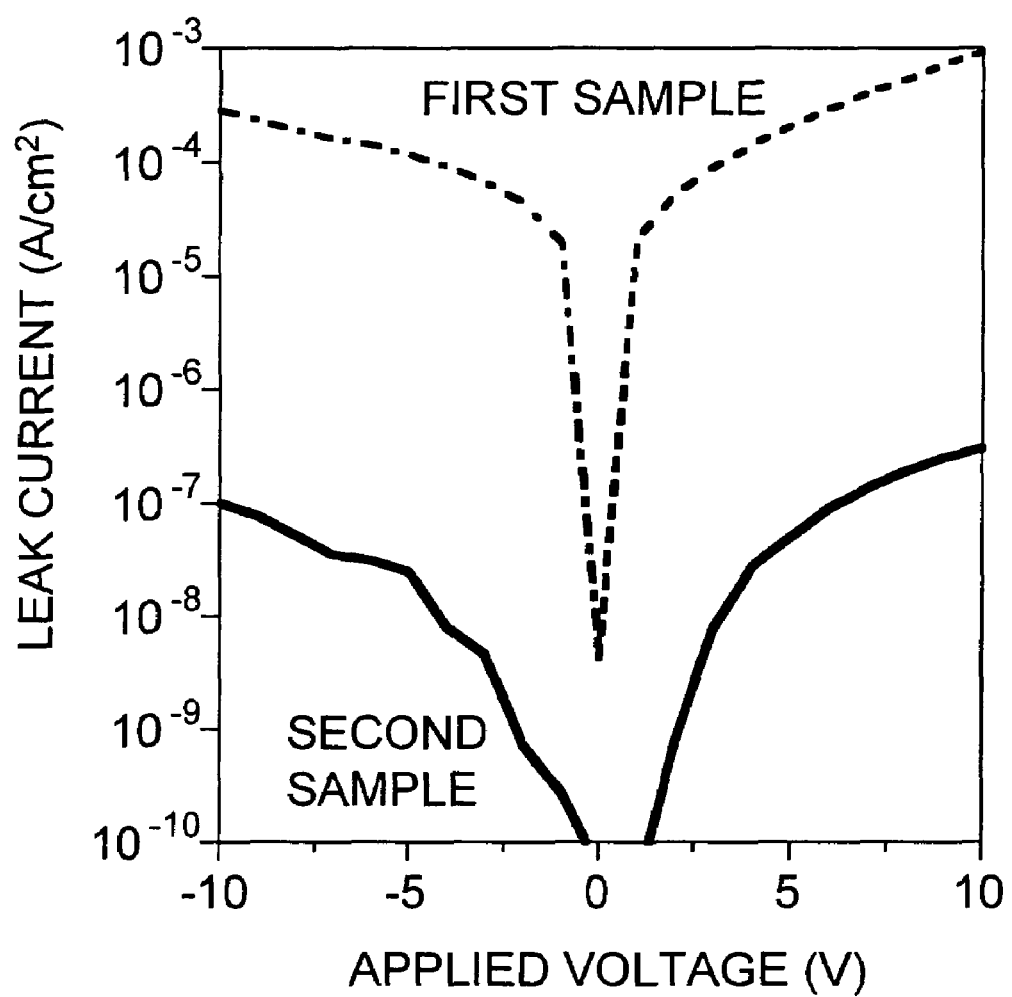
FIG. 3 is also a graphic chart showing a measurement result of leakage current for 100 seconds.

Subsequently, the measurement result of leakage current for voltage steps of 100 seconds will be described. As shown in FIG. 2 and FIG. 3, the leakage current of the first sample was substantially higher than that of the second sample. Based on this, in the first sample, the fatigue characteristic was considered to be improved. Note that the graphic charts shown in FIG. 2 and FIG. 3 are different in content of Pb in the PZT film, in which the content of Pb shown in the graphic chart in FIG. 2 is higher than that in FIG. 3 by approximately 2% to 3%.

Figure 4:
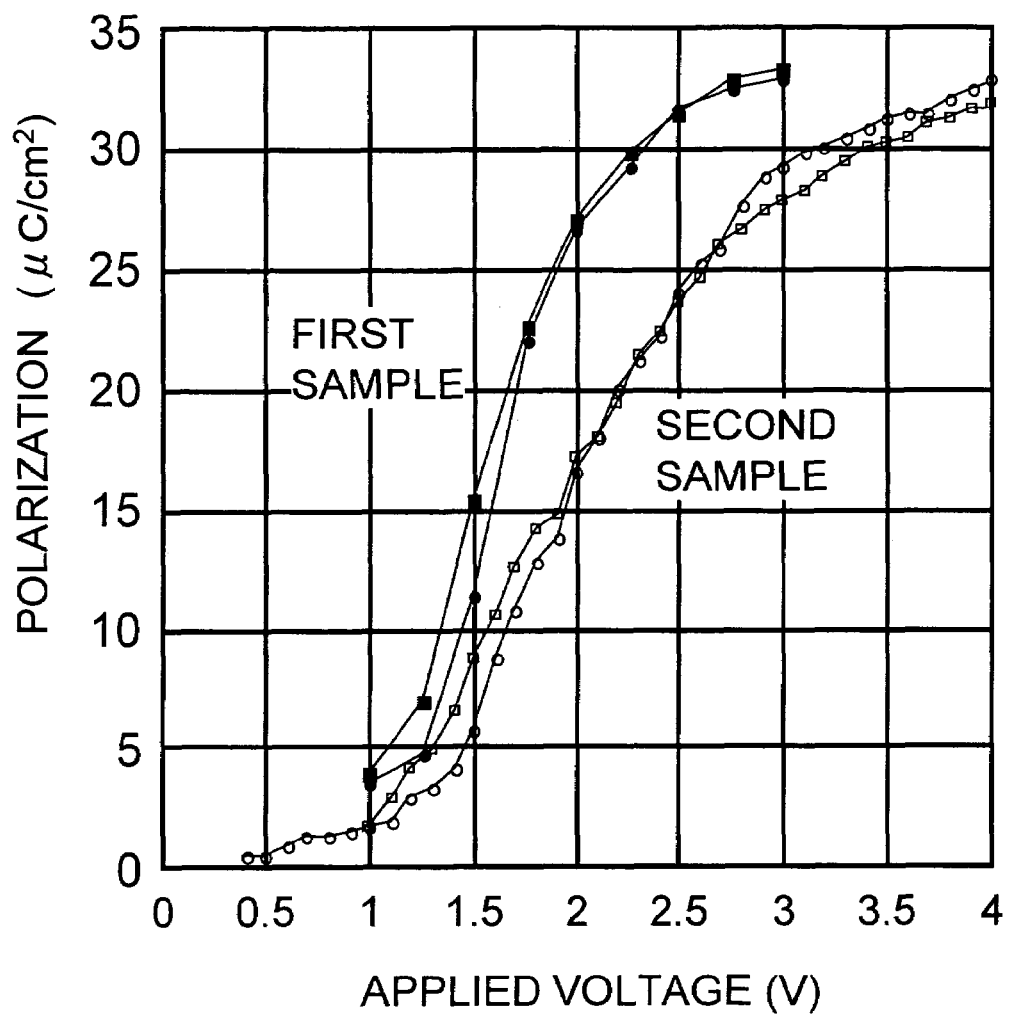
FIG. 4 is a graphic chart showing a measurement result of polarization under low voltage.

Subsequently, the measurement result of polarization under low voltage will be described. As shown in FIG. 4, the polarization of the first sample was higher than that of the second sample. In particular, the large difference was seen between the first sample and the second sample at an applied voltage of approximately 1.5V to 2.0V. Moreover, at a voltage of practical use (approximately at 3V), the fluctuation in polarization in response to the variation in the applied voltage was smaller in the first sample than in the second sample. This indicates that operational stability against the variation in the applied voltage is more favorable in the first sample. Note that, in FIG. 4, "●" shows the result when positive voltage was applied to the upper electrode of the first sample, "■" shows the result when negative voltage was applied to the upper electrode of the first sample, "○" shows the result when positive voltage was applied to the upper electrode of the second sample, and "□" shows the result when negative voltage was applied to the upper electrode of the second sample.

Figure 5:
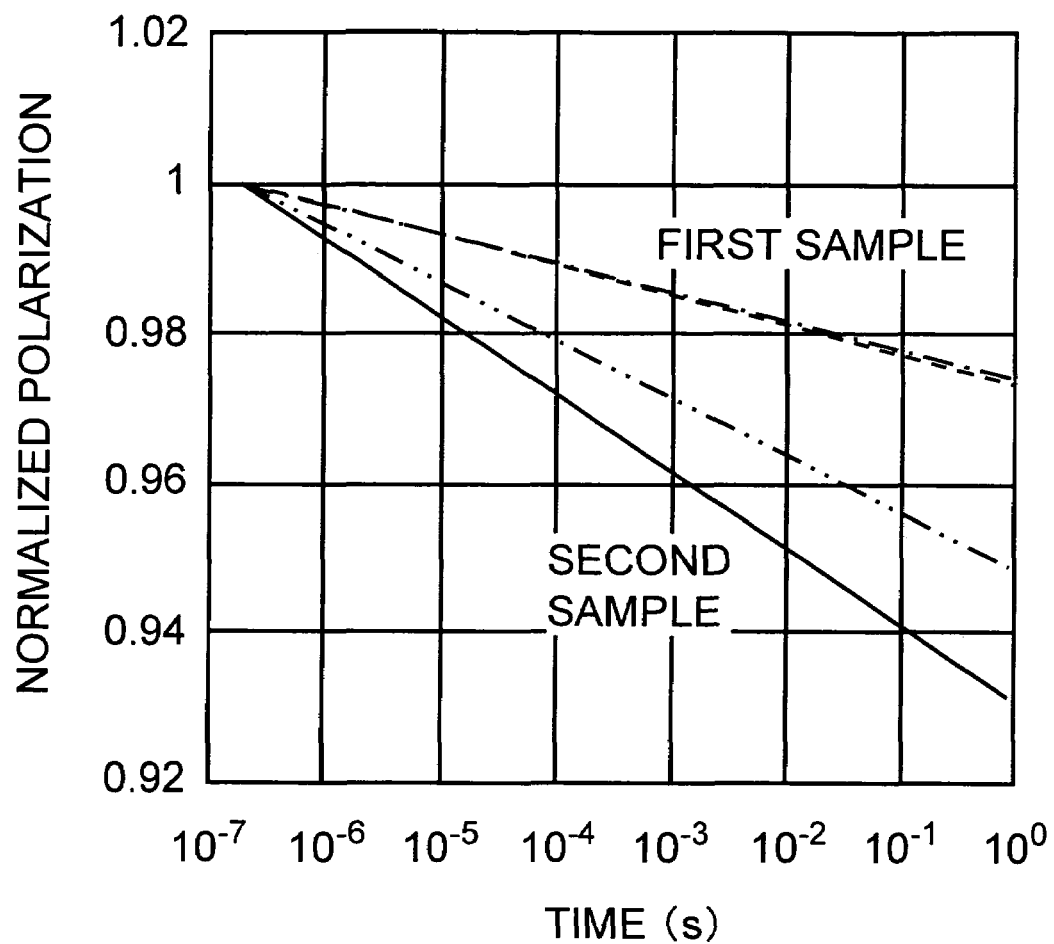
FIG. 5 is graphic chart showing a measurement result of polarization retention.

Subsequently, the measurement result of polarization retention will be described. As shown in FIG. 5, the normalized polarization (polarization retention) of the first sample was higher than that of the second sample. Note that, in FIG. 5, a dashed line shows the result obtained when positive voltage was applied to the upper electrode of the first sample, a dotted line shows the result when negative voltage was applied to the upper electrode of the first sample, a solid line shows the result when positive voltage was applied to the upper electrode of the second sample, and a chain double-dashed line shows the result when negative voltage was applied to the upper electrode of the second sample.

Figure 6:
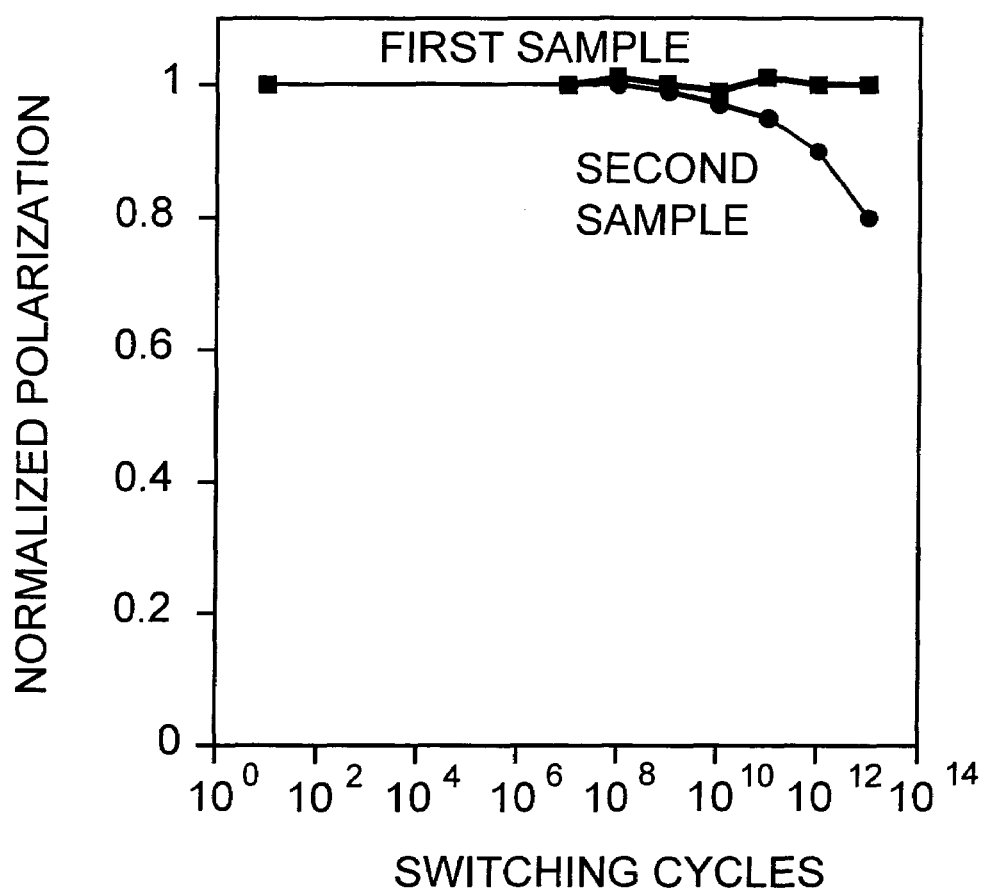
FIG. 6 is a graphic chart showing a measurement result of a fatigue endurance.
Figure 11:
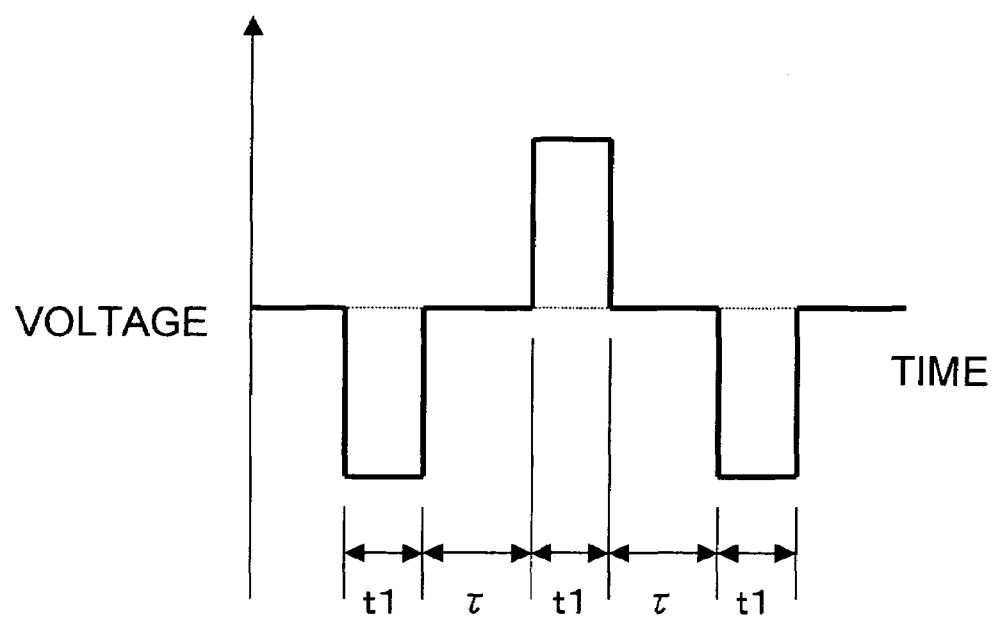
FIG. 11 is a view showing an example applied voltage at the polarization retention measurement.

Subsequently, the measurement result of a fatigue characteristic will be described. In this measurement, as shown in FIG. 11, positive and negative pulses were repeatedly applied between the upper electrode and the lower electrode to find a relation between an interval of pulses (time: τ) and a polarization. The value of r was defined as 150 ns and 1s, and the voltage application time t1 was defined as 150 ns. As a result, as shown in FIG. 6, fatigue was observed when the number of cycles exceeded $10^8$ in the second sample while no fatigue was caused in the first sample even when the number of cycles exceeded $10^{12}$.

Figure 7:
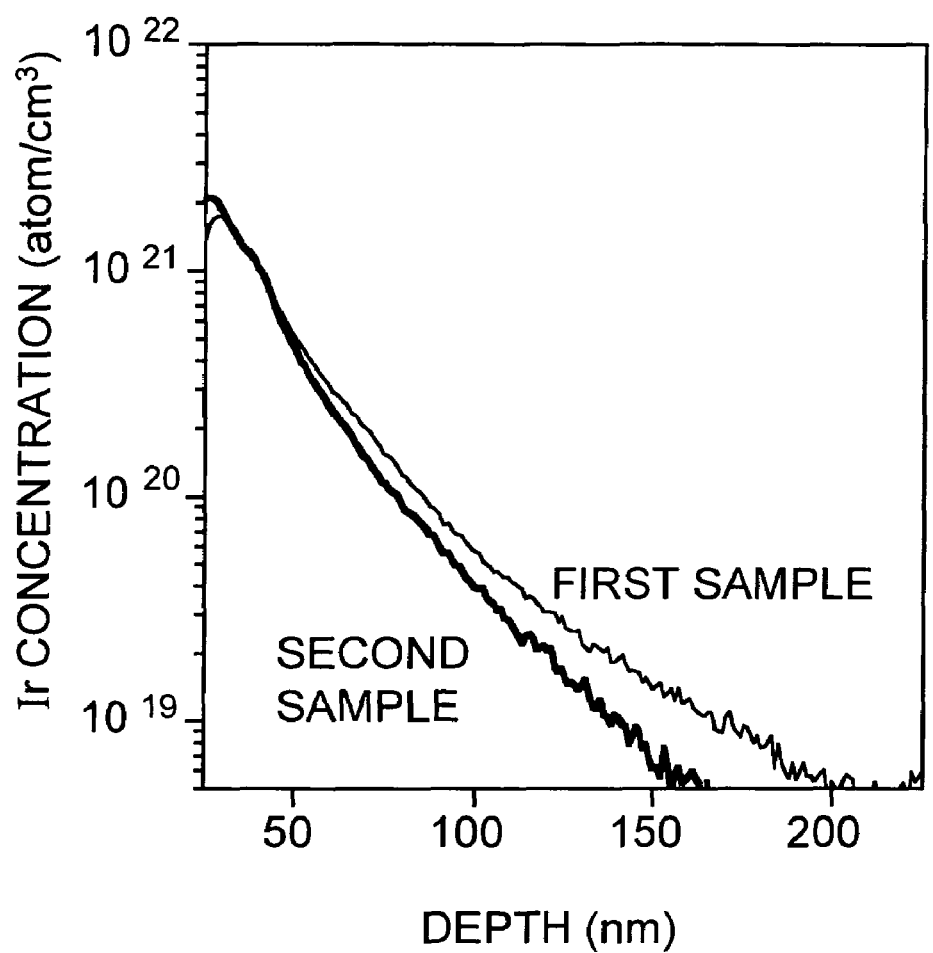
FIG. 7 is a graphic chart showing a result of SIMS for Ir.

Subsequently, the result of conducting a SIMS (secondary ion mass spectrometer) will be described. As shown in FIG. 7, Ir diffused from the surface into the PZT film deeper in the first sample than in the second sample. Note that FIG. 7 indicates presence of Ir in the PZT film even in the second sample, whereas this is considered not due to the diffusion of Ir but due to the entering of the upper electrode into the minute grooves existing along the PZT grain boundaries in the PZT film in the second sample as previously described.

Figure 8:
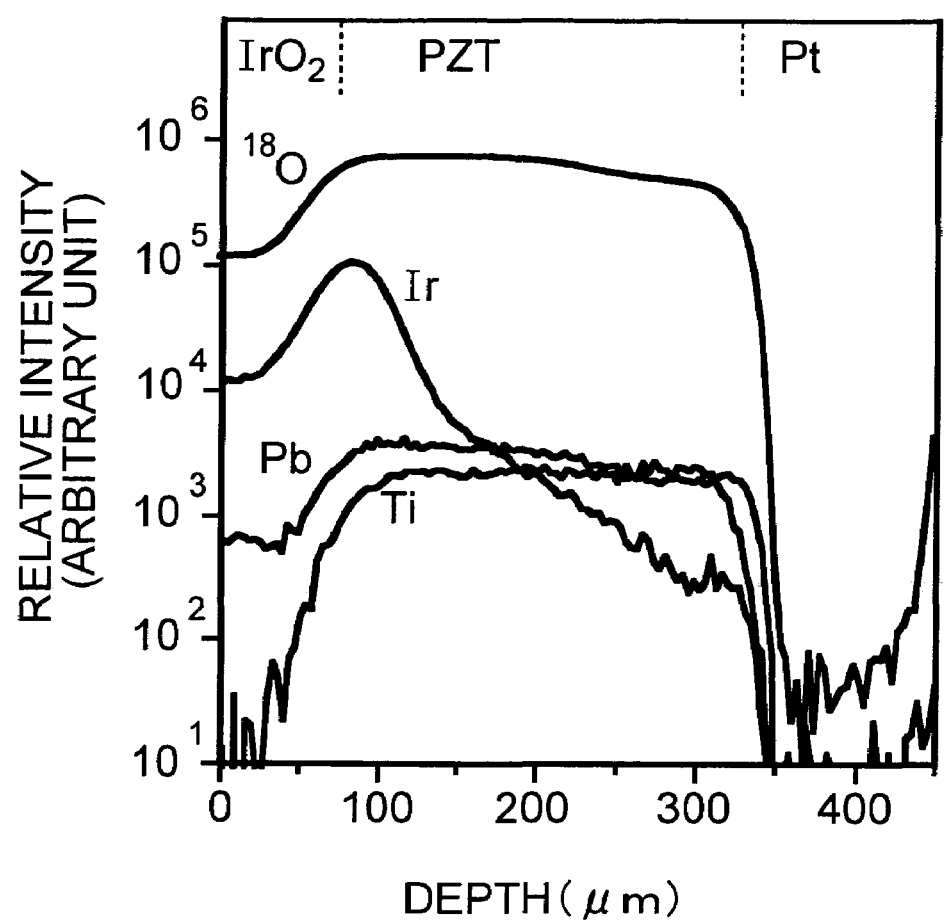
FIG. 8 is a graphic chart showing a result of SIMS for respective elements.

Further, in FIG. 8, the result of the SIMS (secondary ion mass spectrometer) performed on the first sample was detailed. As shown in FIG. 8, the diffusion of Ir into the PZT film and the fluctuation in the content of Ir in the PZT film were confirmed.

Figure 9A:
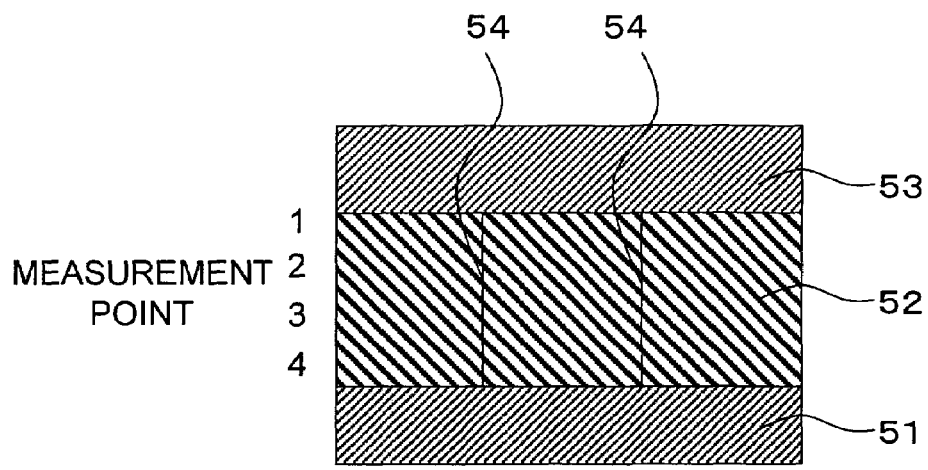
FIG. 9A is a sectional view illustrating a structure of a first sample.
Figure 9B:
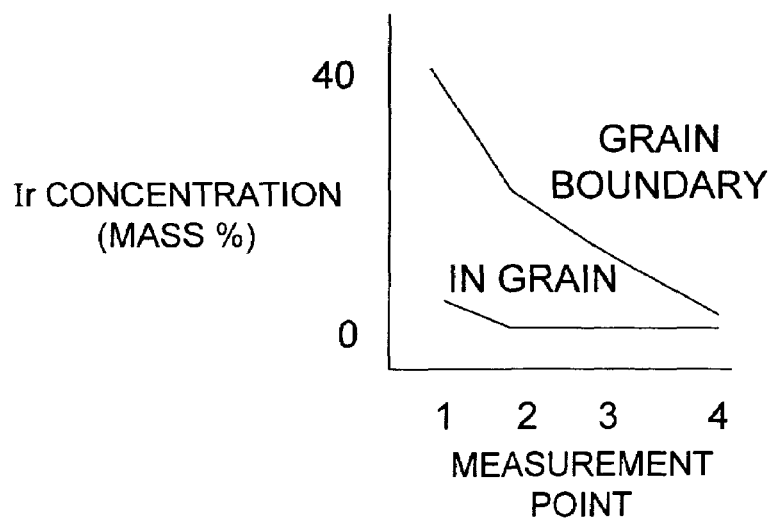
FIG. 9B is a distribution of Ir concentrations of the first sample.

Subsequently, the difference in leakage characteristic between the first sample and the second sample will be described using FIG. 9A and FIG. 9B. Here, it is assumed that the first sample be provided with a lower electrode 51 composed of a Pt film, a PZT film 52 having excess Pb, and an upper electrode 53 composed of an $IrO_x$ film as shown in FIG. 9A, and an annealing be performed after the formation of the $IrO_x$ film. In such a first sample, when annealing, Ir diffuses from the $IrO_x$ film having a non-stoichiometric composition into the PZT film, and Ir concentrates at an interface in the PZT film 52 with the upper electrode 53 and at grain boundaries 54 in the PZT film 52, so that the Ir concentrations in these interface and boundaries become higher as compared to the concentrations in grains. As a result, the fatigue characteristic is improved as the leakage current increases. Incidentally, the distribution of the Ir concentrations as shown in FIG. 9B is obtainable, for example, by a SIMS.

On the other hand, in the second sample, there exists no excess Pb in the PZT film, and the upper electrode is composed of the $IrO_2$ film, so that no Ir diffuses into the PZT film. Therefore, the leakage current does not increase and the fatigue characteristic is not improved.

Figure 10A:
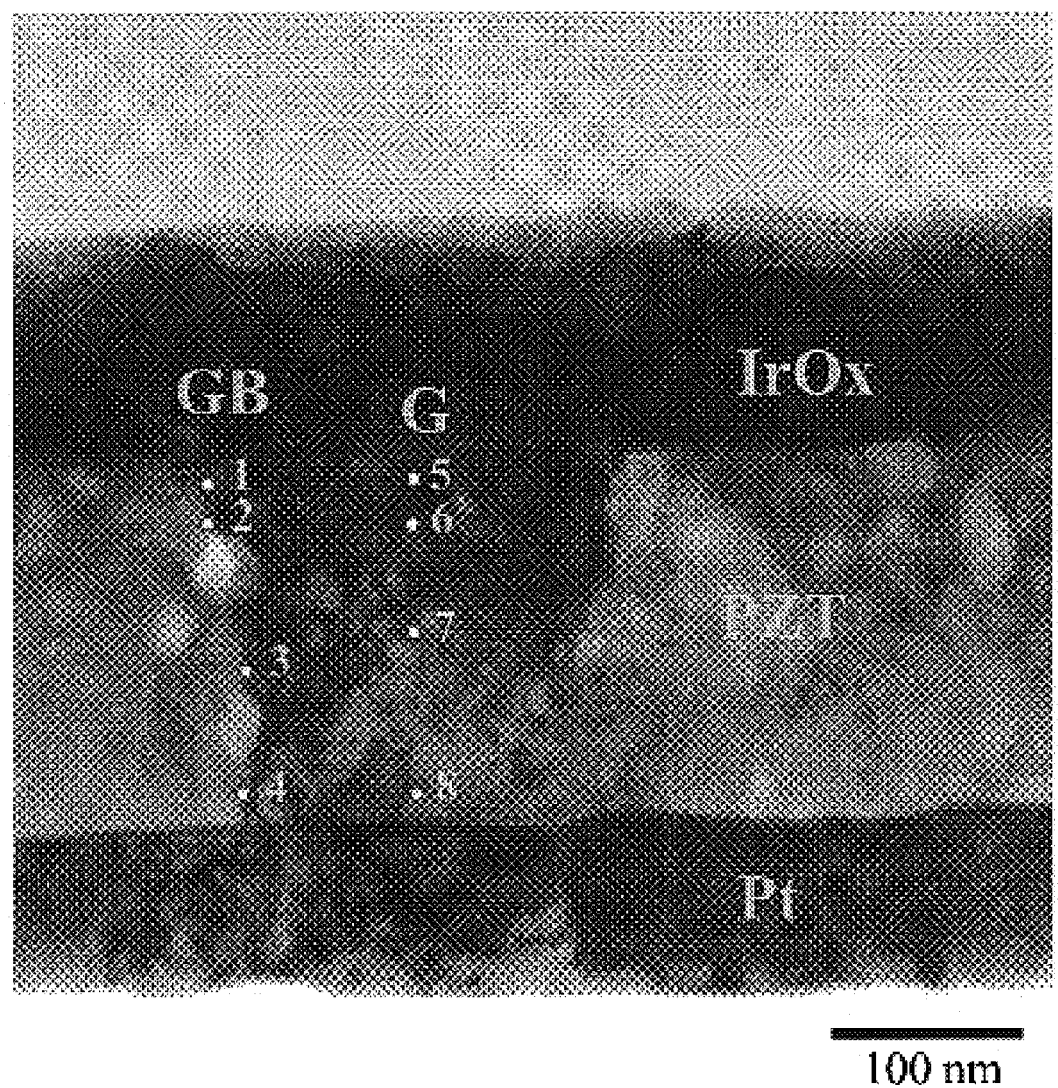
FIG. 10A is a view showing a transmission electron micrograph of a section of the first sample.
Figure 10B:
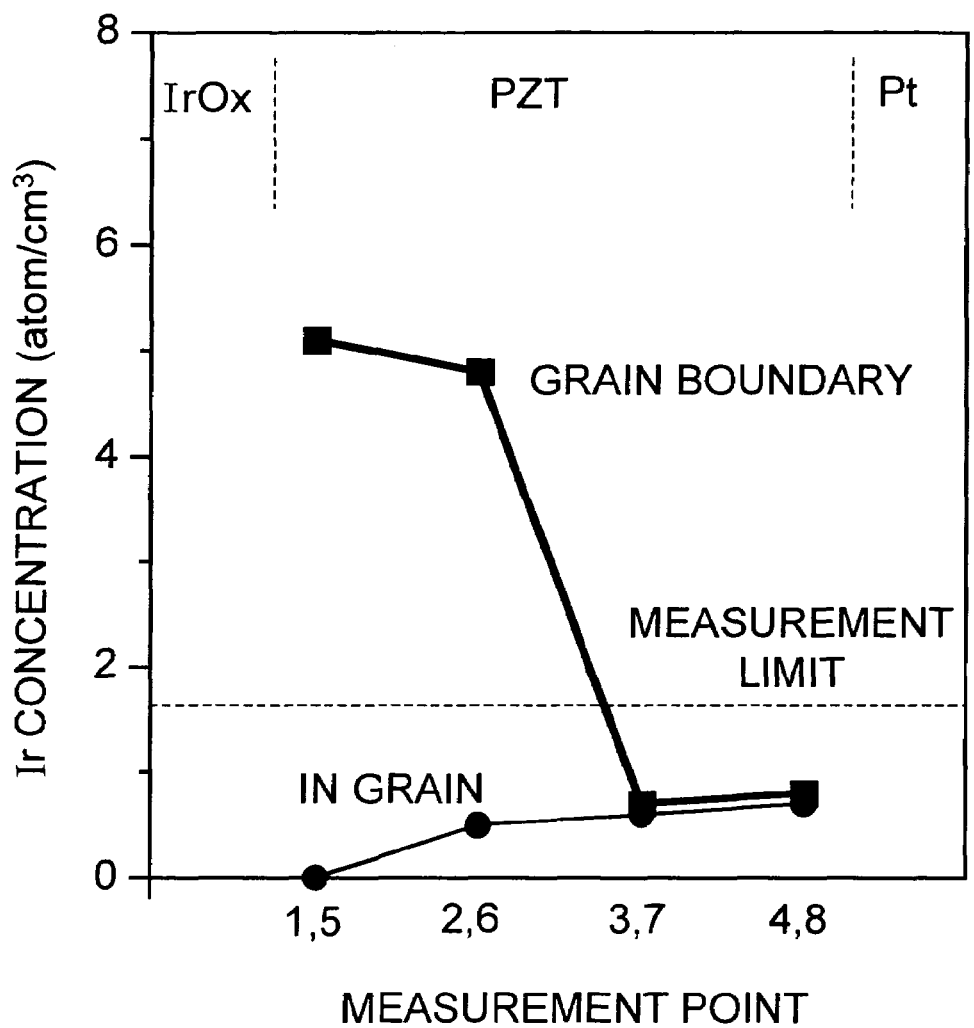
FIG. 10B is a graphic chart showing Ir concentrations in respective points in FIG. 10A.

FIG. 10A is a transmission electron micrograph showing a section of the first sample, and FIG. 10B is a graphic chart showing concentrations of Ir at respective points in FIG. 10A. The graphic chart shown in FIG. 10B was obtained by a measurement using a TEM-EDX (energy dispersive X-ray analyzer). As shown in FIG. 10A and FIG. 10B, in the grain, the diffusion of Ir from the upper electrode ($IrO_x$ film) into the PZT film was at a level of out of measure, while the diffusion of Ir from the upper electrode into the PZT film was confirmed at the grain boundaries. Note that the values of Ir concentrations equal to or below the measurement limit lack reliability, and that the Ir concentrations in the grains increases as the depth increases but within the scope of a measurement error.

Figure 12A:
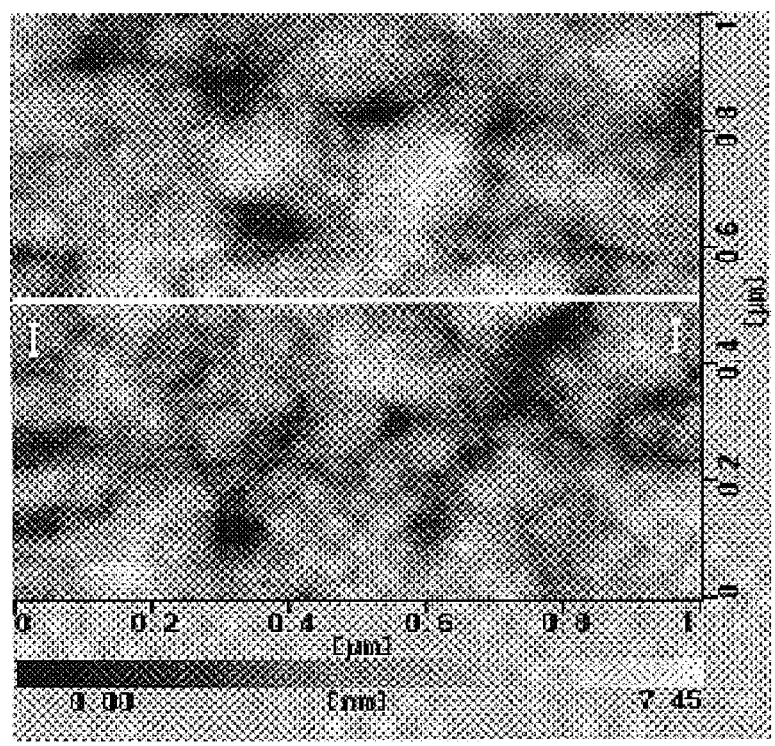
FIG. 12A is a view showing an atomic force micrograph of a surface of a PZT film of the first sample.
Figure 12B:
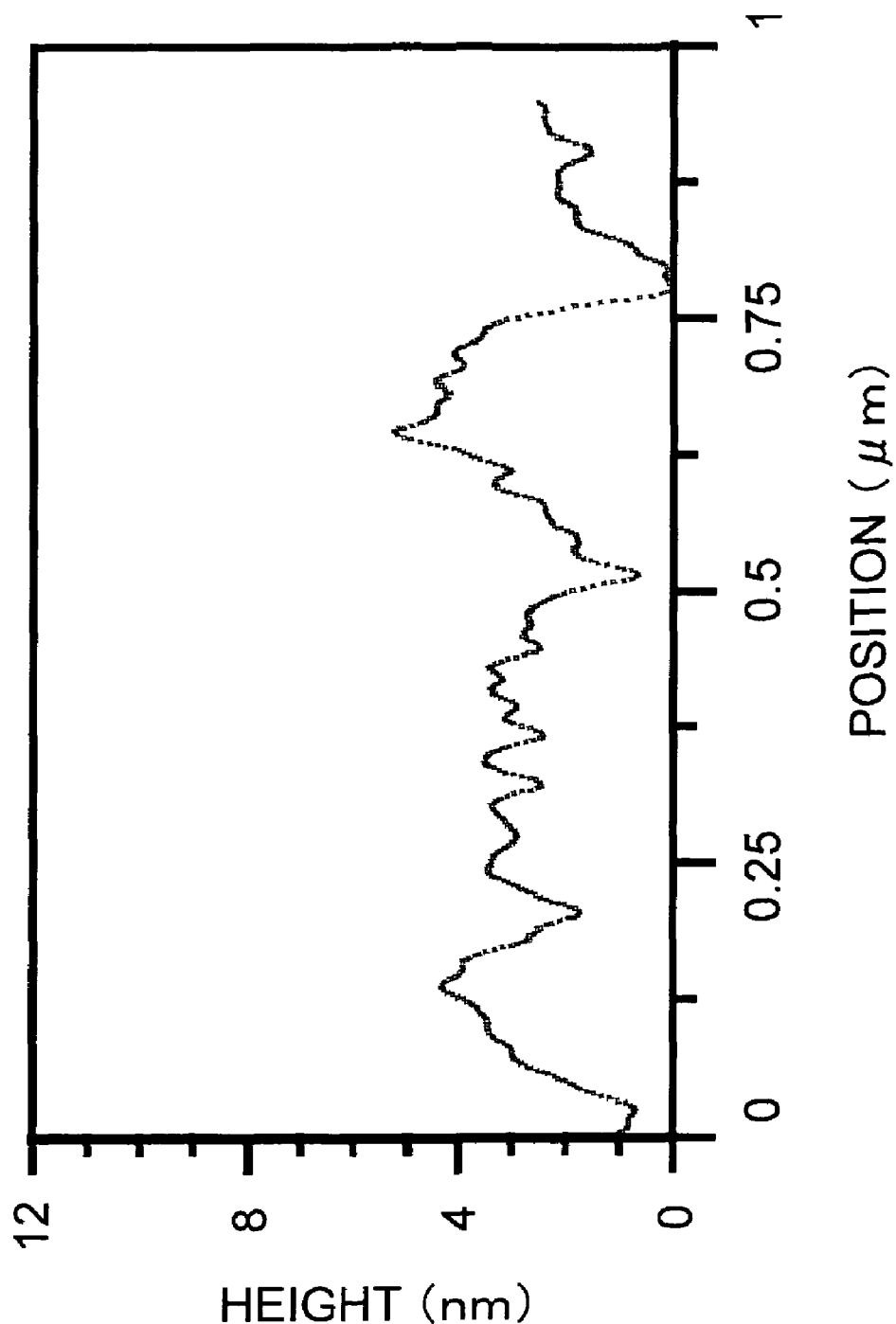
FIG. 12B is a graphic chart showing a level of roughness on a surface of a section taken along a I-I line in FIG. 12A.
Figure 13A:
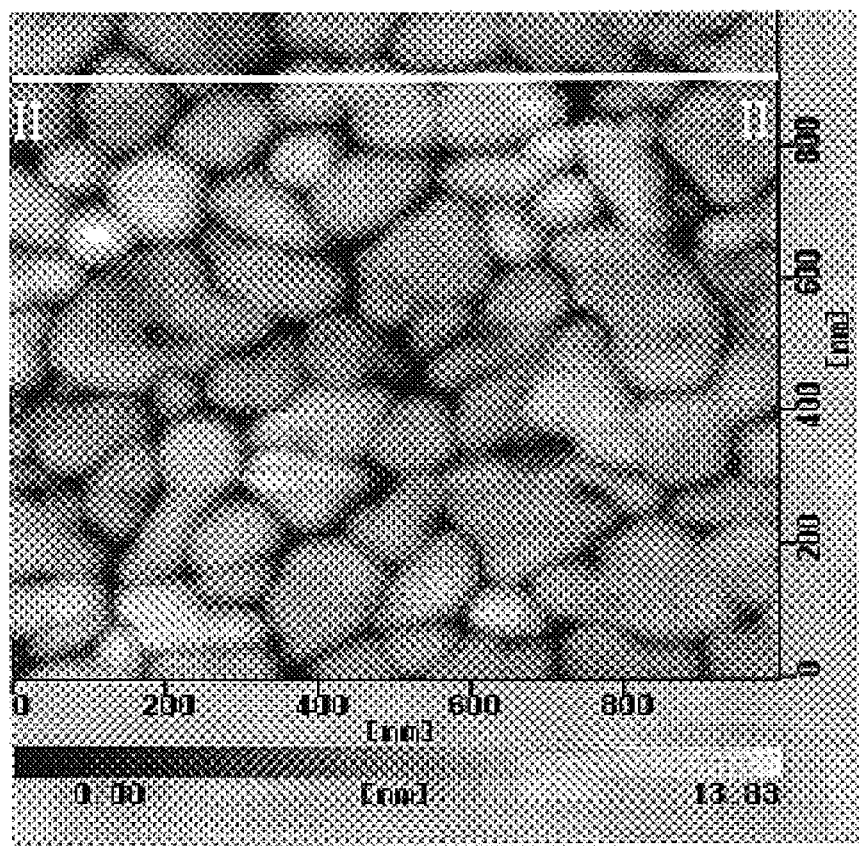
FIG. 13A is a view showing an atomic force micrograph of a surface of a PZT film of a second sample.
Figure 13B:
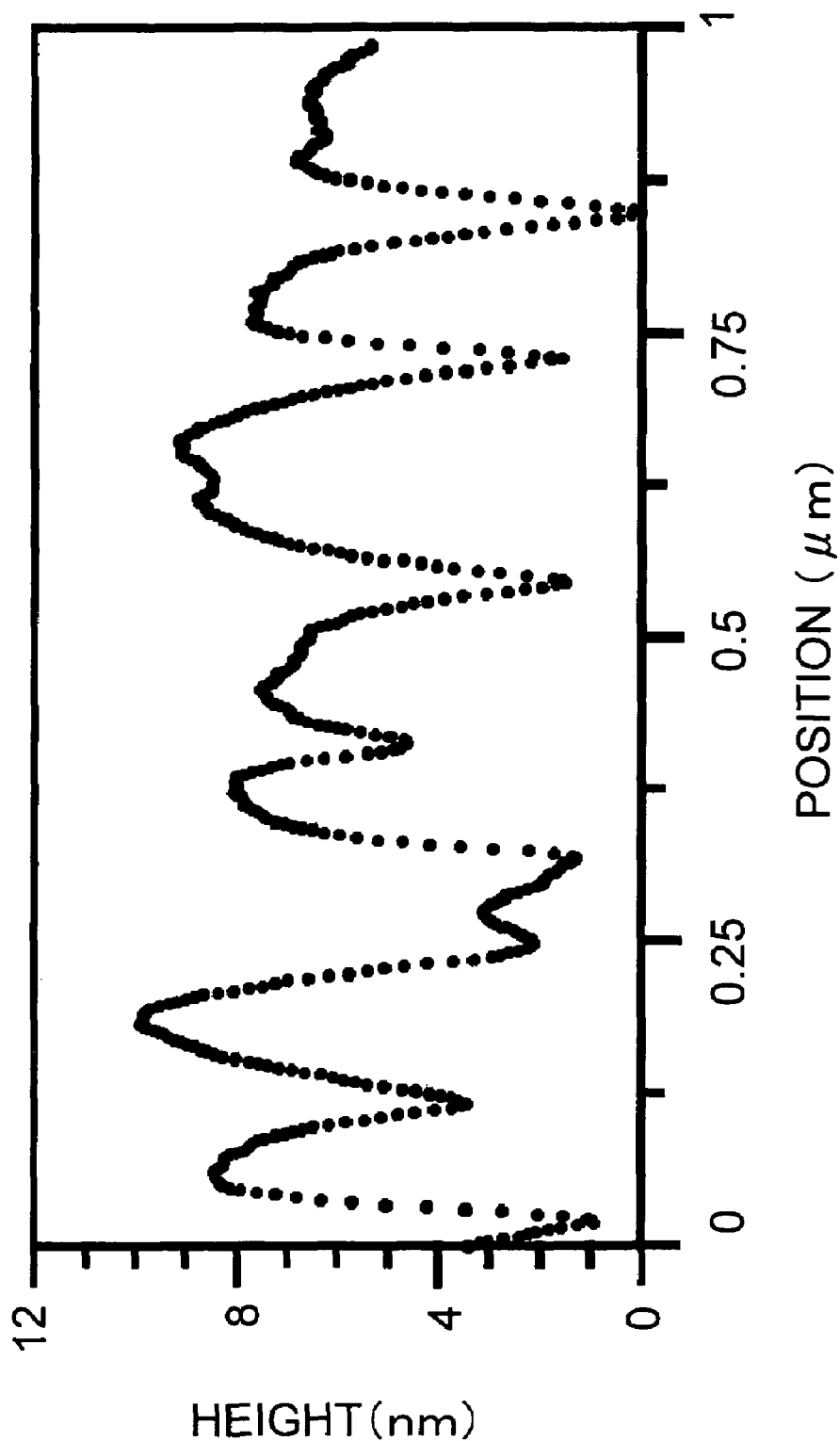
FIG. 13B is a graphic chart showing a level of roughness on a surface of a section taken along a II-II line in FIG. 13A.

Subsequently, the observation result of the surface of the PZT film utilizing an AFM (Atomic Force Microscope) will be described. FIG. 12A is a view showing an atomic force micrograph of the surface of the PZT film of the first sample, and FIG. 12B is a graphic chart showing the level of roughness on the surface of the section taken along a I-I line in FIG. 12A. FIG. 13A is a view showing an atomic force micrograph of the surface of the PZT film of the second sample, and FIG. 13B is a graphic chart showing the level of roughness on the surface of the section taken along a II-II line in FIG. 13A. As is understood based on the comparison between FIG. 12A and FIG. 12B and FIG. 13A and FIG. 13B, the roughness on the surface was smaller in the first sample than in the second sample. The reason is that the PZT film was crystallized after it was formed in an amorphous state when fabricating the first sample, while the PZT film was formed in a crystallized state by a MOCVD method when fabricating the second sample. Note that the atomic force micrographs shown in FIG. 12A and FIG. 13A were taken after forming the PZT films and before forming the upper electrodes.

Figure 14:
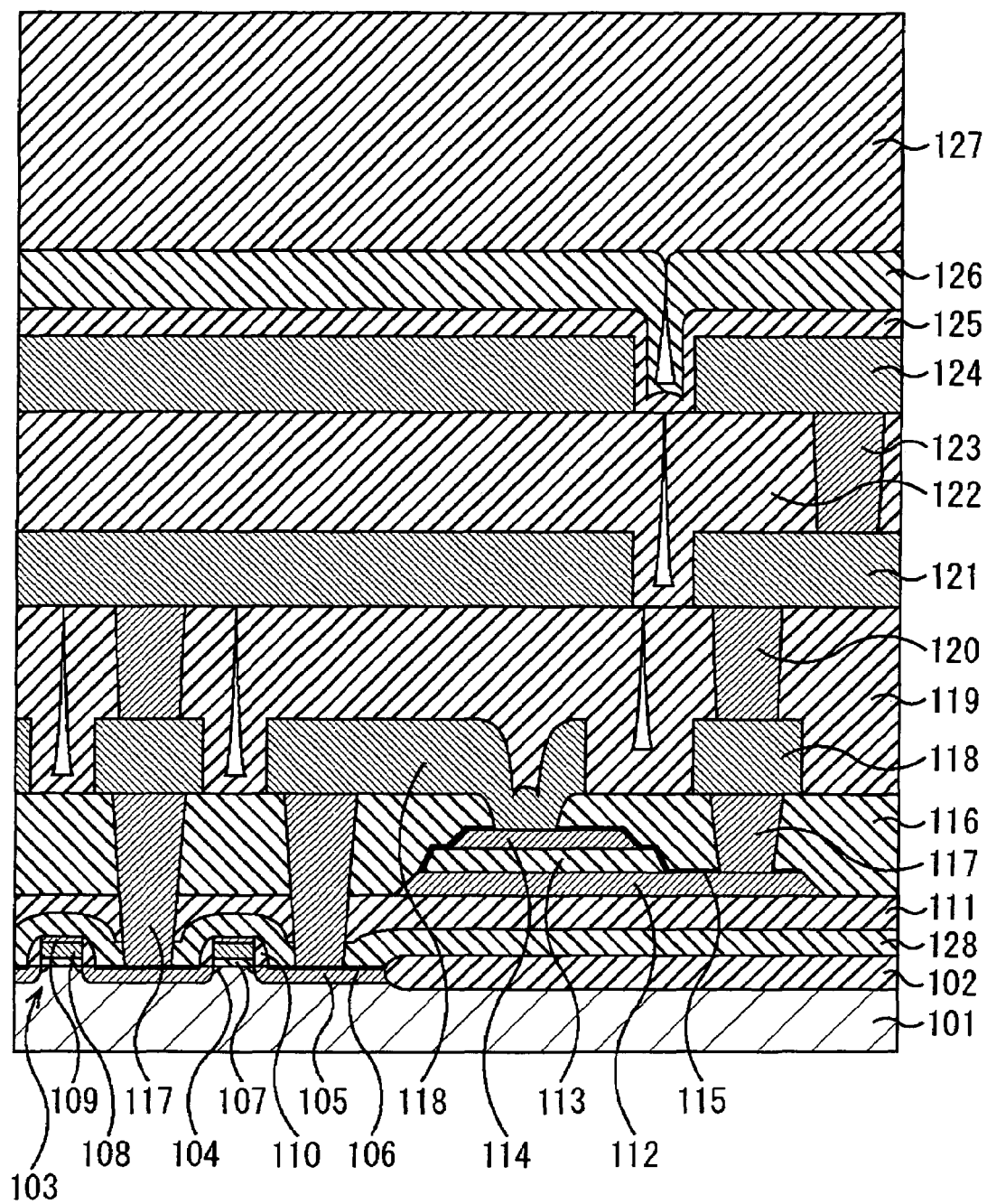
FIG. 14 is a sectional view illustrating an overall structure of a ferroelectric memory.
Figure 15:
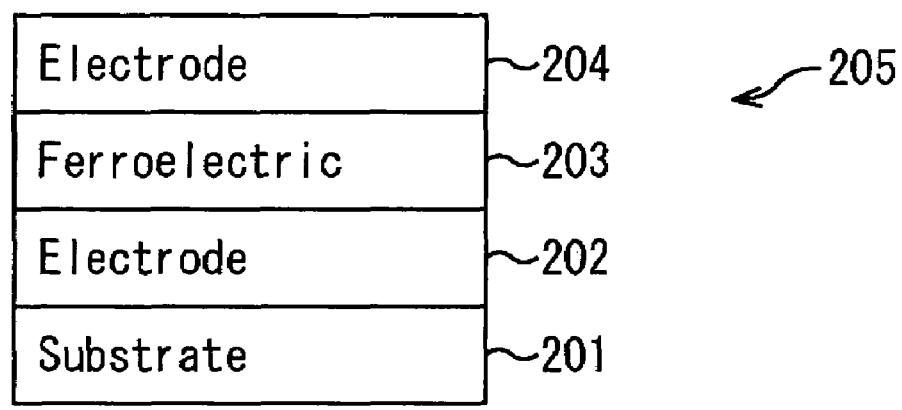
FIG. 15 is a sectional view illustrating a structure of a ferroelectric capacitor.

Subsequently, the overall structure of the ferroelectric memory adopting the above-described embodiments will be described. FIG. 14 is a sectional view illustrating the overall structure of the ferroelectric memory.

An element isolation insulating film 102 is selectively formed on the surface of a semiconductor substrate 101. In the region partitioned by the element isolation insulating film 102, MOS transistors 103 are formed. The MOS transistor 103 is provided with a low-concentration diffusion layer 104, a high-concentration diffusion layer 105, a titanium silicide film 106, a gate insulating film 107, a gate electrode 108, a tungsten silicide film 109, and a sidewall 110. Then, a silicon oxynitride film 128 covering the element isolation insulating film 102 and the MOS transistor 103 is formed, and a silicon oxide film 111 is formed thereon as an interlayer insulating film.

On the silicon oxide film 111, a lower electrode 112 is selectively formed, and a ferroelectric film 113 and an upper electrode 114 are sequentially stacked thereon. The ferroelectric film 113 is composed, for example, of a PZT film including excess Pb, and the upper electrode 114 is composed, for example, of an $IrO_{1.4}$ film. Further, Ir in the $IrO_{1.4}$ film is partially diffused into the ferroelectric film 113 by annealing. The ferroelectric film 113 is smaller than the lower electrode 112 and the upper electrode 114 is smaller than the ferroelectric film 113, in plain view. The lower electrode 112, the ferroelectric film 113, and the upper electrode 114 compose a ferroelectric capacitor. A film 115 wrapping the ferroelectric capacitor is formed. Further, a silicon oxide film 116 is formed as an interlayer insulating film covering the ferroelectric capacitor and the like.

In the silicon oxide film 116 and the film 115, a hole reaching to the upper electrode 112 is formed. Also, in the silicon oxide films 116, 111, holes reaching to a titanium silicide film 106 are formed. In these holes, tungsten films 117 are buried. Further, in the silicon oxide film 116 and the film 115, a hole reaching to the upper electrode 114 is formed. Then, on the silicon oxide film 116, a wiring layer 118 contacting the tungsten layers 117 is formed. A part of the wiring layer 118 also contacts the upper electrode 114 through the hole reaching to the upper electrode 114. Accordingly, through this part of the wiring layer 118, the upper electrode 114 and the high-concentration diffusion layer 115 of the MOS transistor 103 are connected. On the silicon oxide film 116, a silicon oxide film 119 is formed as an interlayer insulating film covering the wiring layer 118.

In the silicon oxide film 119, holes reaching to the wiring layer 118 are formed, and a tungsten film 120 is buried in the hole. On the silicon oxide film 119, a wiring layer 121 contacting the tungsten film 120 is formed. Further, on the silicon oxide film 119, a silicon oxide film 122 is formed as an interlayer insulating film covering the wiring layer 121.

In the silicon oxide film 122, a hole reaching to the wiring layer 121 is formed, and a tungsten film 123 is buried in the hole. Then, on the silicon oxide film 122, a wiring layer 124 contacting the tungsten film 123 is formed. Further, on the silicon oxide film 122, a pad silicon oxide film 125 and a pad silicon nitride film 126 covering the wiring layer 124 are sequentially formed. On the pad silicon nitride film 126, there is formed a sealing film 127 made of polyimide, for example.

It should be noted that, there is presented a graphic chart in Patent Document 4 that shows a result of a SIMS in which Ir seems to exist in a PZT film, however, in the method shown in Patent Document 4, such a part of the PZT film that includes excess Pb is intentionally removed before the formation of the upper electrode, so that the diffusion of Ir as caused in the present invention is impossible to be verified, and therefore the seeming existence of Ir is just an emergence of an error that is typical in the SIMS.

INDUSTRIAL APPLICABILITY

As has been described in the above, according to the present invention, a high fatigue endurance characteristic can be obtained. It is generally known that, in a ferroelectric capacitor provided with an electrode composed of a conductive compound, the fatigue endurance is improved as leakage current increases, and in the present invention, a cation of a conductive compound composing an upper electrode is also included in a ferroelectric film, so that the leakage current increases.

What is claimed is

1. A ferroelectric capacitor comprising:
   a lower electrode;
   a ferroelectric film formed on said lower electrode; and
   an upper electrode formed on said ferroelectric film and composed of a conductive compound,
   a cation composing the conductive compound also existing in said ferroelectric film,
   wherein said conductive compound is iridium oxide with a composition of $IrO_x$ ($1<x<2$).

2. The ferroelectric capacitor according to claim 1, wherein concentrations of the cation at a grain boundary in said ferroelectric film is higher than the concentrations of the cation within a grain in said ferroelectric film.

3. The ferroelectric capacitor according to claim 1, wherein concentrations of the cation in said ferroelectric film lowers as the distance from said upper electrode increases.

4. The ferroelectric capacitor according to claim 1, wherein said ferroelectric film is composed of $Pb(Zr,Ti)O_3$ including excess Pb.

5. The ferroelectric capacitor according to claim 1, wherein said ferroelectric film is composed of $(Ba,Sr)TiO_3$ including excess Ba.

6. The ferroelectric capacitor according to claim 1, wherein said ferroelectric film is composed of $(Bi,La)_4Ti_3O_{12}$ including excess Bi.

7. The ferroelectric capacitor according to claim 1, wherein a composition of The conductive compound is out of a stoichiometric composition.

8. The ferroelectric capacitor according to claim 1, wherein a composition of The conductive compound varies in a surface of said ferroelectric film.

9. The ferroelectric capacitor according to claim 1, wherein a composition of the conductive compound varies in a surface and in The film thickness direction of said ferroelectric film.

10. The ferroelectric capacitor according to claim 1, wherein said upper electrode contains 10% by mass or less of the cation and/or an impurity.

11. The ferroelectric capacitor according to claim 1, wherein grooves having a substantially uniform depth are formed in a surface of said ferroelectric film along a grain boundary of said ferroelectric film.

* * * * *